(12) United States Patent
Kazama

(10) Patent No.: US 7,719,123 B2
(45) Date of Patent: May 18, 2010

(54) METHOD OF MANUFACTURING SEMICONDUCTOR DEVICE

(75) Inventor: Takuya Kazama, Nagano (JP)

(73) Assignee: Shinko Electric Industries Co., Ltd., Tokyo (JP)

( * ) Notice: Subject to any disclaimer, the term of this patent is extended or adjusted under 35 U.S.C. 154(b) by 0 days.

(21) Appl. No.: 12/190,789

(22) Filed: Aug. 13, 2008

(65) Prior Publication Data

US 2009/0045529 A1    Feb. 19, 2009

(30) Foreign Application Priority Data

Aug. 17, 2007    (JP)    ............... 2007-212949

(51) Int. Cl.
*H01L 23/48*    (2006.01)
*H01L 29/40*    (2006.01)
(52) U.S. Cl. .................. 257/784; 257/786; 257/686; 438/617
(58) Field of Classification Search ......... 257/736–737, 257/686, 700, 784, 786, E27.137; 438/612, 438/617
See application file for complete search history.

(56) References Cited

U.S. PATENT DOCUMENTS 5,412,539 A * 5/1995 Elwell et al. ................. 361/792

6,133,627 A * 10/2000 Khandros et al. ........... 257/692

FOREIGN PATENT DOCUMENTS

| EP | 1 005 086 | 5/2000 |
|---|---|---|
| EP | 1 933 377 | 6/2008 |
| JP | 2002-313985 | 10/2002 |

* cited by examiner

*Primary Examiner*—Theresa T Doan
(74) *Attorney, Agent, or Firm*—Rankin, Hill & Clark LLP

(57) ABSTRACT

There is provided a method of manufacturing a semiconductor device. The method includes the successive steps of: (a) providing a semiconductor substrate; (b) forming a plurality of semiconductor chips having electrode pads on the semiconductor substrate; (c) forming internal connection terminals on the electrode pads; (d) forming an insulating layer on the plurality of semiconductor chips to cover the internal connection terminals; (e) forming a metal layer on the insulating layer; (f) pushing a whole area of the metal layer to bring the metal layer into contact with upper end portions of the internal connection terminals; (g) pushing portions of the metal layer which contact the upper end portions of the internal connection terminals, thereby forming first recesses in the internal connection terminals, and thereby forming second recesses in the metal layer; and (h) forming wiring patterns by etching the metal layer.

1 Claim, 20 Drawing Sheets

METHOD OF MANUFACTURING SEMICONDUCTOR DEVICE

This application is based on and claims priority from Japanese Patent Application No. 2007-212949, filed on Aug. 17, 2007, the entire contents of which are incorporated by reference herein.

BACKGROUND

1. Technical Field

The present disclosure relates to a method of manufacturing a semiconductor device and, more particularly, to a method of manufacturing a semiconductor device, in which upper end portions of internal connection terminals, which are provided to electrode pads of a plurality of semiconductor chips formed on a semiconductor substrate, are electrically connected to wiring patterns.

2. Related Art

FIG. 1 is a sectional view of a semiconductor device in the related art.

By reference to FIG. 1, a semiconductor device 100 (e.g., a chip-size package) in the related art includes a semiconductor chip 101, internal connection terminals 102, a resin layer 103, wiring patterns 104, a solder resist 106, and external connection terminals 107.

The semiconductor chip 101 has a sheet-like semiconductor substrate 110, a semiconductor integrated circuit 111, a plurality of electrode pads 112, and a protection film 113. The semiconductor integrated circuit 111 is provided on the surface side of the semiconductor substrate 110. The semiconductor integrated circuit 111 is composed of a diffusion layer, an insulating layer, vias, wirings, and the like. The plurality of electrode pads 112 are provided on the semiconductor integrated circuit 111. The plurality of electrode pads 112 are connected electrically to the wirings provided on the semiconductor integrated circuit 111. The protection film 113 is provided on the semiconductor integrated circuit 111. The protection film 113 is a film for protecting the semiconductor integrated circuit 111.

The internal connection terminals 102 are provided on the electrode pads 112 respectively. Upper surfaces of upper end portions of the internal connection terminals 102 are exposed from the resin layer 103. The upper end portions of the internal connection terminals 102 are connected to the wiring patterns 104. The resin layer 103 is provided to cover the semiconductor substrate 110 on the side on which the internal connection terminals 102 are provided.

The wiring patterns 104 are provided on the resin layer 103. The wiring patterns 104 are connected to the internal connection terminals 102 respectively. The wiring patterns 104 are connected electrically to the electrode pads 112 via the internal connection terminals 102. The wiring patterns 104 have an external connection terminal providing area 104A, on which the external connection terminal 107 is provided, respectively. The solder resist 106 is provided on the resin layer 103 to cover the wiring patterns 104 except the external connection terminal providing areas 104A.

FIG. 2 to FIG. 10 are views showing steps of manufacturing the semiconductor device in the related art. In FIG. 2 to FIG. 10, the same reference symbols are affixed to the same constituent portions as those of the semiconductor device 100 shown in FIG. 1 in the related art.

At first, in steps shown in FIG. 2, the semiconductor chip 101 having the semiconductor integrated circuit 111, the plurality of electrode pads 112, and the protection film 113 is formed on the surface side of the semiconductor substrate 110. A thinning process is not applied to the semiconductor substrate 110 yet. Then, in steps shown in FIG. 3, the internal connection terminals 102 are formed on the plurality of electrode pads 112 respectively. In this stage, there is variation in height of the plurality of internal connection terminals 102.

Then, in steps shown in FIG. 4, a flat plate 115 is pushed against the upper end portions of the plurality of internal connection terminals 102, and thus respective heights of a plurality of internal connection terminals 102 are set uniformly. Then, in steps shown in FIG. 5, the resin layer 103 is formed to cover the semiconductor chip 101 and the internal connection terminals 102 on the side on which the internal connection terminals 102 are formed.

Then, in steps shown in FIG. 6, the resin layer 103 is polished until upper surfaces 102A of the upper end portions of the internal connection terminals 102 are exposed from the resin layer 103. At this time, the polishing is carried out until an upper surface 103A of the resin layer 103 is almost same level as the upper surfaces 102A of the upper end portions of the internal connection terminals 102.

Then, in steps shown in FIG. 7, the wiring patterns 104 are formed on the upper surface 103A of the resin layer 103. Then, in steps shown in FIG. 8, the solder resist 106 is formed on the resin layer 103 such that this resist covers the wiring patterns 104 except the external connection terminal providing areas 104A.

Then, in steps shown in FIG. 9, the semiconductor substrate 110 is polished from the back surface side to reduce a thickness of the semiconductor substrate 110. Then, in steps shown in FIG. 10, the external connection terminal 107 is formed on the external connection terminal providing areas 104A respectively. As a result, the semiconductor device 100 is manufactured (see e.g., Japanese Patent No. 3614828).

However, in the method of manufacturing the semiconductor device 100 in the related art, the step of making the height of the plurality of internal connection terminals 102 uniform and the step of exposing the upper surfaces 102A of the plurality of internal connection terminals 102 from the resin layer 103 by polishing the resin layer 103 are required. Therefore, such a problem existed that the number of steps is increased and thus a production cost of the semiconductor device 100 is increased.

Also, upon polishing the resin layer 103, it is difficult to remove the resin layer 103 existing on the upper surfaces 102A of the upper end portions of the internal connection terminals 102 with good precision. Therefore, the resin layer 103 still remains on the upper surfaces 102A of the upper end portions of the internal connection terminals 102. As a result, such a problem existed that adhesion between the internal connection terminals 102 and the wiring patterns 104 is degraded (in the worst case, peeling occurs between the internal connection terminals 102 and the wiring patterns 104), a resistance value between the internal connection terminals 102 and the wiring patterns 104 is increased. Thus, the yield of the semiconductor device 100 is lowered.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a method of manufacturing a semiconductor device, capable of reducing a production cost of the semiconductor device and also improving yields of the semiconductor device by reducing the number of steps.

According to one or more aspects of the present invention, in a method of manufacturing a semiconductor device, the method includes the successive steps of:

(a) providing a semiconductor substrate;

(b) forming a plurality of semiconductor chips having electrode pads on the semiconductor substrate;

(c) forming internal connection terminals on the electrode pads;

(d) forming an insulating layer on the plurality of semiconductor chips to cover the internal connection terminals;

(e) forming a metal layer on the insulating layer;

(f) pushing a whole area of the metal layer to bring the metal layer into contact with upper end portions of the internal connection terminals;

(g) pushing portions of the metal layer which contact the upper end portions of the internal connection terminals, thereby forming first recesses in the internal connection terminals, and thereby forming second recesses in the metal layer; and (h) forming wiring patterns by etching the metal layer.

According to one or more aspects of the present invention, contact areas between the metal layer and the upper end portions of the internal connection terminals after step (g) are larger than those after step (f) and before step (g).

According to one or more aspects of the present invention, in step (g), the metal layer is brought into contact with bottom surfaces and side surfaces of the first recesses.

According to one or more aspects of the present invention, in a method of manufacturing a semiconductor device, the method includes the successive steps of:

(a) providing a semiconductor substrate;

(b) forming a plurality of semiconductor chips having electrode pads on the semiconductor substrate;

(c) forming internal connection terminals on the electrode pads;

(d) forming an insulating layer on the plurality of semiconductor chips to cover the internal connection terminals;

(e) forming a metal layer on the insulating layer;

(f) pushing a whole area of the metal layer to bring the metal layer into contact with upper end portions of the internal connection terminals;

(g) forming wiring patterns by etching the metal layer; and (h) pushing portions of the wiring patterns which contact the upper end portions of the internal connection terminals, thereby forming first recesses in the internal connection terminals, and thereby forming second recesses in the wiring patterns.

According to one or more aspects of the present invention, contact areas between the wiring patterns and the upper end portions of the internal connection terminals after step (h) are larger than contact areas between the metal layer and the upper end portions of the internal connection terminals after step (f) and before step (h).

According to one or more aspects of the present invention, in step (h), the wiring patterns are brought into contact with bottom surfaces and side surfaces of the first recess.

According to one or more aspects of the present invention, step (g) includes:

pushing portions of the metal layer which contact outer peripheral portions of the upper end portions of the internal connection terminals.

According to one or more aspects of the present invention, after step (g), at least a part of outer peripheral side surfaces of the upper end portions of the internal connection terminals is covered with portions of the metal layer provided on the first recesses.

According to one or more aspects of the present invention, step (h) includes:

pushing portions of the wiring patterns which contact outer peripheral portions of the upper end portions of the internal connection terminals.

According to one or more aspects of the present invention, after step (h), at least a part of outer peripheral side surfaces of the upper end portions of the internal connection terminals is covered with the wiring patterns.

According to one or more aspects of the present invention, in step (e), a Cu foil is laminated on the insulating layer According to one or more aspects of the present invention, a semiconductor device includes:

a semiconductor substrate;

a semiconductor chip formed on the semiconductor substrate and having an electrode pad;

an insulating layer formed on the semiconductor chip;

an internal connection terminal formed on the electrode pad and having a first recess, the first recess being exposed from the insulating layer;

a wiring pattern formed on the insulating layer and having a second recess, the second recess being provided in an area corresponding to an area in which the first recess is provided, wherein the wiring pattern contacts the internal connection terminal in which the first recess is provided;

a solder resist formed on the wiring pattern and having an opening through which a part of the wiring pattern is exposed; and an external connection terminal formed on the exposed wiring pattern.

According to the present invention, not only a reduction in a production cost of the semiconductor device but also improvement in yields of the semiconductor device can be achieved by reducing the number of steps.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF EXEMPLARY EMBODIMENTS OF THE PRESENT INVENTION

Exemplary embodiments of the present invention will be described with reference to the drawings hereinafter.

First Embodiment

Figure 1:
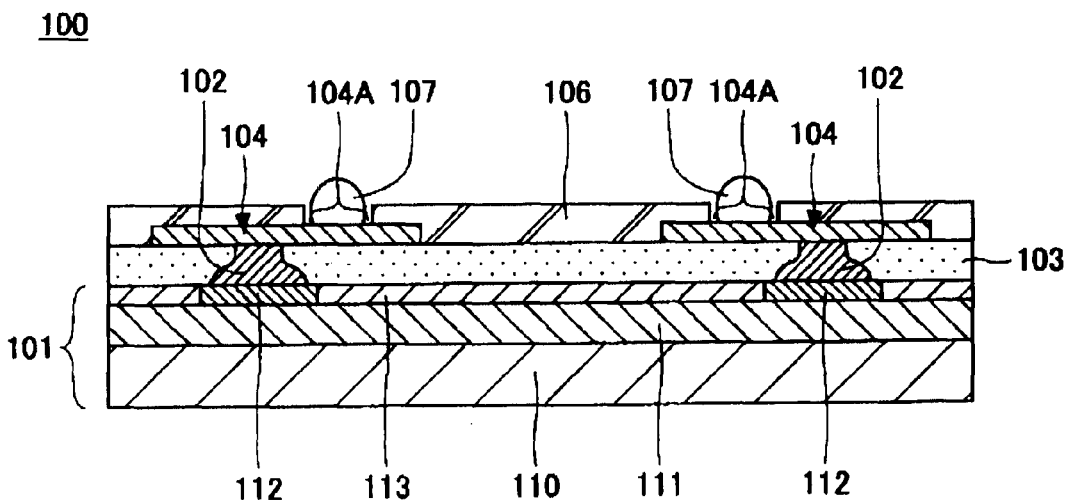
FIG. 1 is a sectional view of a semiconductor device in the related art.
Figure 2:
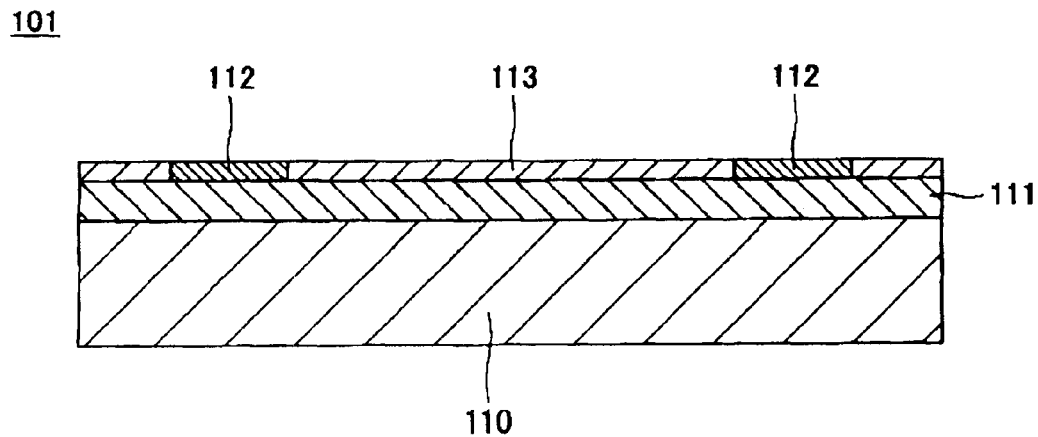
FIG. 2 is a view (#1) showing steps of manufacturing the semiconductor device in the related art.
Figure 3:
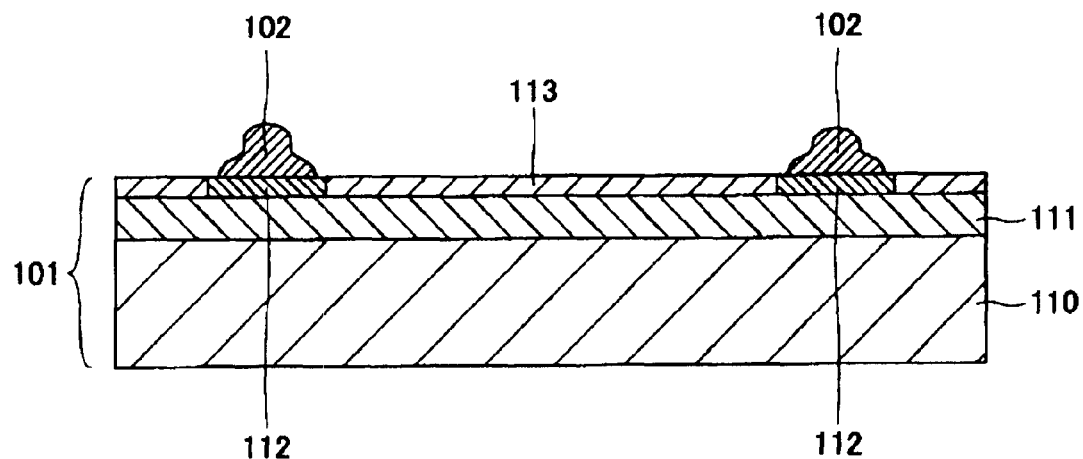
FIG. 3 is a view (#2) showing steps of manufacturing the semiconductor device in the related art.
Figure 4:
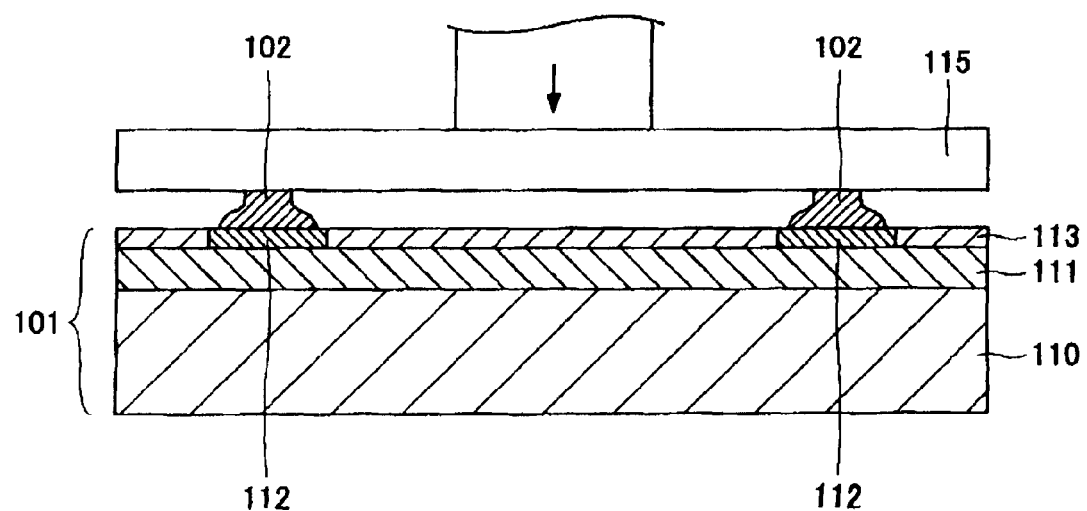
FIG. 4 is a view (#3) showing steps of manufacturing the semiconductor device in the related art.
Figure 5:
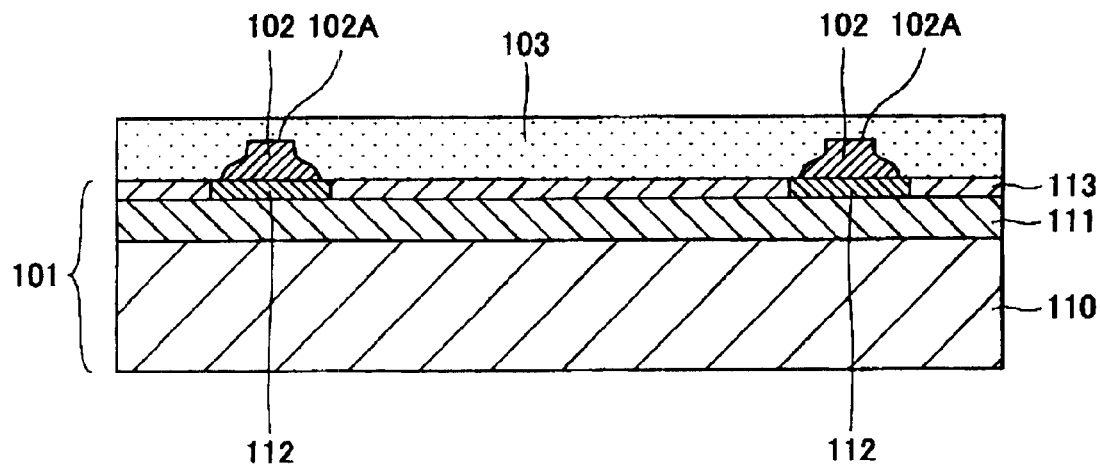
FIG. 5 is a view (#4) showing steps of manufacturing the semiconductor device in the related art.
Figure 6:
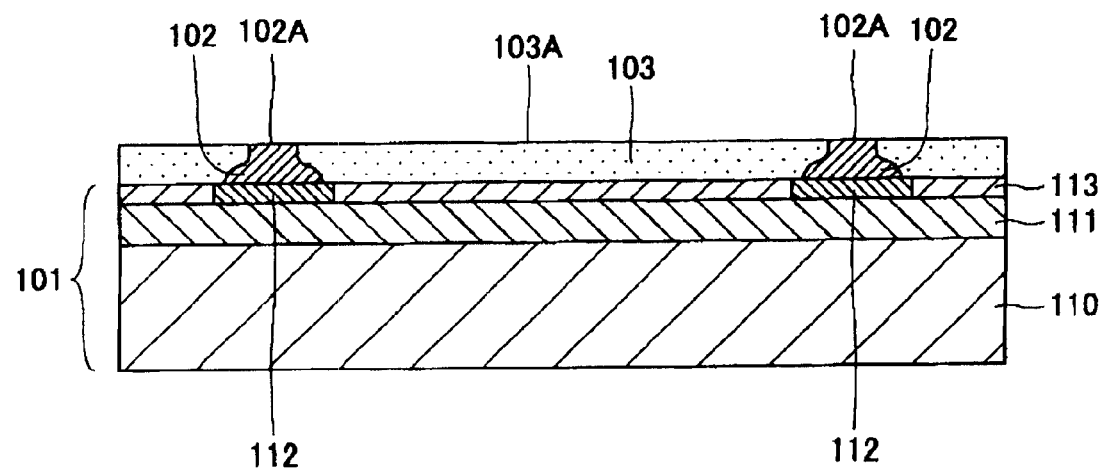
FIG. 6 is a view (#5) showing steps of manufacturing the semiconductor device in the related art.
Figure 7:
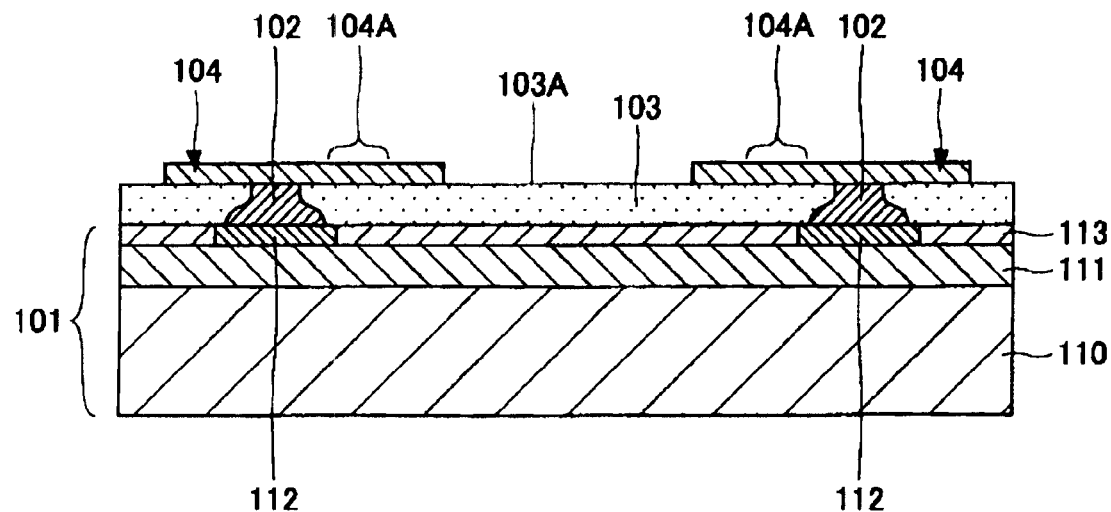
FIG. 7 is a view (#6) showing steps of manufacturing the semiconductor device in the related art.
Figure 8:
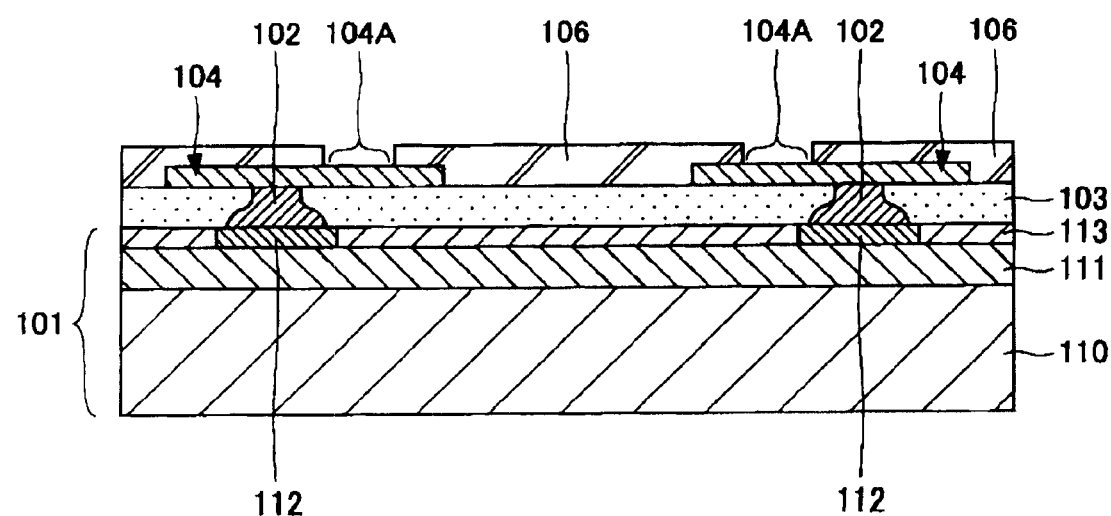
FIG. 8 is a view (#7) showing steps of manufacturing the semiconductor device in the related art.
Figure 9:
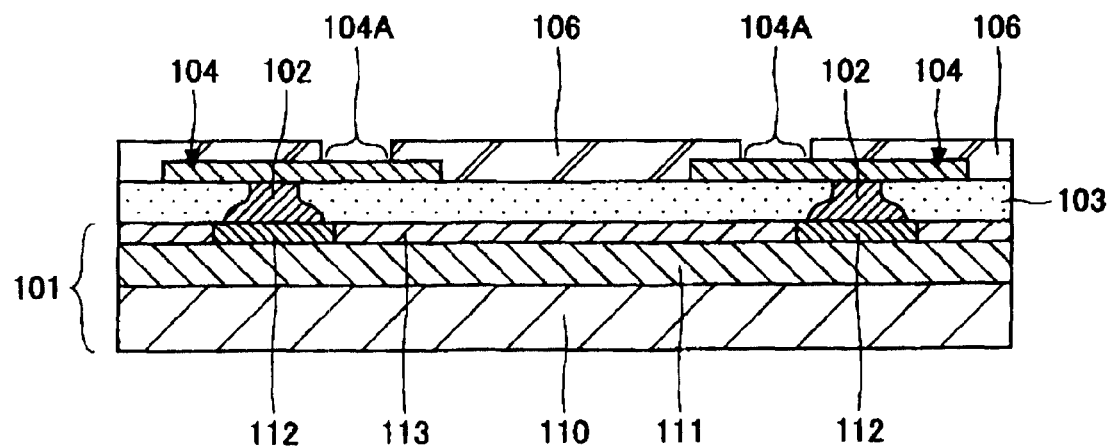
FIG. 9 is a view (#8) showing steps of manufacturing the semiconductor device in the related art.
Figure 10:
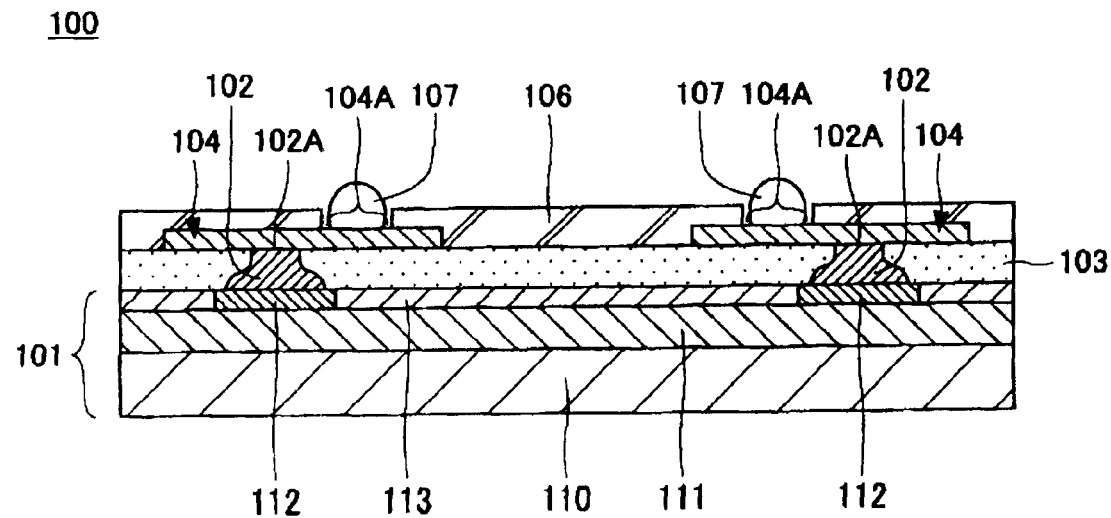
FIG. 10 is a view (#9) showing steps of manufacturing the semiconductor device in the related art.
Figure 11:
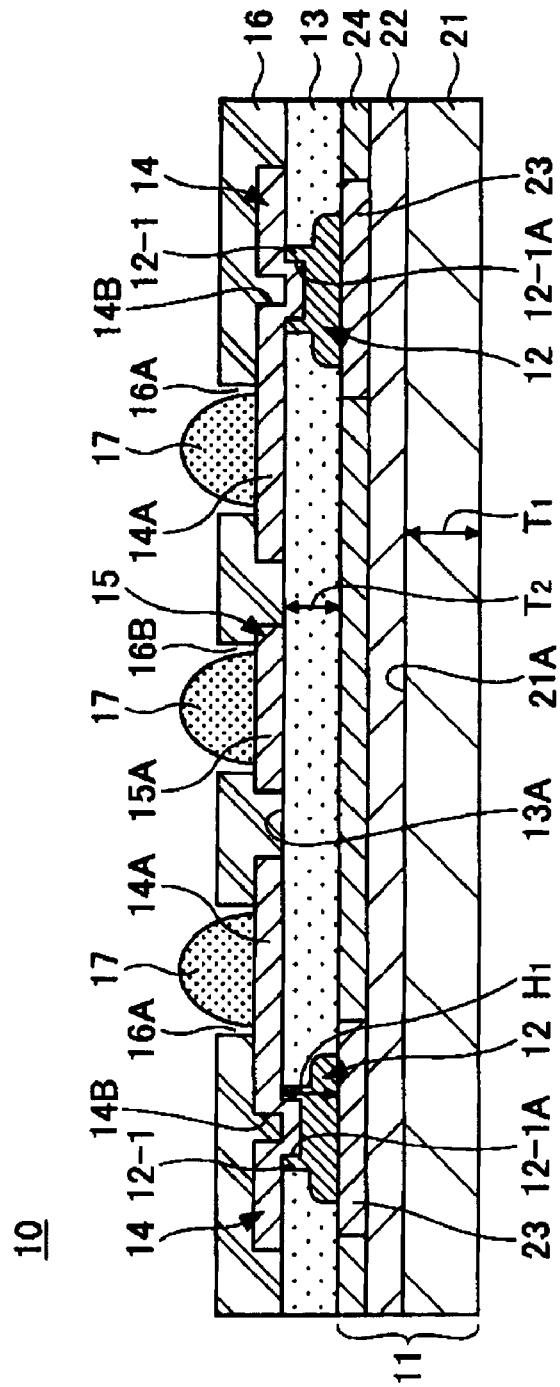
FIG. 11 is a sectional view of a semiconductor device according to a first embodiment of the present invention.

FIG. 11 is a sectional view of a semiconductor device according to a first embodiment of the present invention.

By reference to FIG. 11, a semiconductor device 10 includes a semiconductor chip 11, internal connection terminals 12, an insulating layer 13, wiring patterns 14, 15, a solder resist 16, and external connection terminals 17.

The semiconductor chip 11 has a semiconductor substrate 21, a semiconductor integrated circuit 22, electrode pads 23, and a protection film 24. The semiconductor substrate 21 is used to form the semiconductor integrated circuit 22. The semiconductor substrate 21 is shaped into a thin plate. A thickness $T_1$ of the semiconductor substrate 21 can be set to 100 to 300 µm, for example. As the semiconductor substrate 21, for example, a silicon substrate (concretely, individual pieces of the sheet-like silicon wafer) can be used.

The semiconductor integrated circuit 22 is provided on the upper surface 21A side of the semiconductor substrate 21. The semiconductor integrated circuit 22 is composed of a diffusion layer (not shown) formed on the semiconductor substrate 21, an insulating layer (not shown) laminated on the semiconductor substrate 21, vias (not shown) provided in the laminated insulating layer, wirings (not shown), and the like.

The electrode pad 23 is provided in plural on the semiconductor integrated circuit 22. The electrode pads 23 are connected electrically to the wirings (not shown) provided on the semiconductor integrated circuit 22. As the material of the electrode pads 23, for example, Al or an alloy containing Al (e.g., Al—Si—Cu alloy) can be used.

The protection film 24 is provided on the semiconductor integrated circuit 22. The protection film 24 is the film for protecting the semiconductor integrated circuit 22. As the protection film 24, for example, a SiN film, a PSG film, and the like can be used.

The internal connection terminals 12 are provided on the electrode pads 23. Lower end portions of the internal connection terminals 12 are connected electrically to the semiconductor integrated circuit 22 via the electrode pads 23. Upper end portions 12-1 of the internal connection terminals 12 have a recess 12-1A as a first recess on a portion opposing to the wiring pattern 14 respectively. A side surface and a bottom surface of the recess 12-1A and an upper surface of the upper end portion 12-1 of the internal connection terminal 12 contact the wiring pattern 14. Accordingly, the wirings 14 and the semiconductor integrated circuit 22 are connected electrically mutually via the internal connection terminals 12. When a diameter of the upper end portion 12-1 of the internal connection terminal 12 is 40 µm, a diameter of the recess 12-1A can be set to 20 µm, for example. In this case, a depth of the recess 12-1A can be set to 10 µm, for example.

A height $H_1$ of the internal connection terminal 12 is substantially equal to a thickness $T_2$ of the insulating layer 13. A height $H_1$ of the internal connection terminal 12 can be set to 10 µm to 60 µm, for example. As the internal connection terminal 12, for example, Au bump, Au plating film, metal film consisting of a Ni film formed by the electroless plating method and an Au film covering the Ni film can be used. The Au bump can be formed by the bonding method, the plating method, or the like, for example.

The insulating layer 13 is provided to cover respective areas of the internal connection terminals 12 and the semiconductor chip 11 except the upper surfaces of the upper end portion 12-1 and the recess 12-1A of the internal connection terminals 12. As the insulating layer 13, for example, a sheet-like insulating resin with tackiness (e.g., Non Conductive Film (NCF)), a paste-like insulating resin (e.g., Non Conductive Paste (NCP)), an anisotropic conductive resin (e.g., Anisotropic Conductive Film (ACF)), or the like can be used. A thickness $T_2$ of the insulating layer 13 can be set to 10 µm to 60 µm, for example.

The wiring patterns 14 are provided on the upper end portions 12-1 of the internal connection terminals 12 and the insulating layer 13 arranged near the upper end portions 12-1. The wiring pattern 14 has a connection portion 14A and a recess 14B as a second recess. The connection portion 14A is formed on the insulating layer 13. The external connection terminal 17 is provided on the connection portion 14A.

The recess 14B is formed in the portion, which is arranged on the recess 12-1A of the internal connection terminals 12, of the wiring pattern 14. The portion of the wiring pattern 14 which corresponds to a forming area of the recess 14B contacts the side surface and the bottom surface of the recess 12-1A of the internal connection terminal 12. The wiring patterns 14 constructed as above are connected electrically to the semiconductor integrated circuit 22 via the internal connection terminals 12.

In this manner, the recess 12-1A is provided in the internal connection terminal 12 and also the recess 14B is provided on the portion of the wiring pattern 14 which corresponds to the recess 12-1A Thus, the portion, which corresponds to the forming area of the recess 14B, of the wiring pattern 14 is brought into contact with the side surface and the bottom surface of the recess 12-1A. Therefore, a contact area between the internal connection terminal 12 and the wiring pattern 14 is increased, and thus a resistance value between the internal connection terminal 12 and the wiring pattern 14 can be reduced.

As the wiring pattern 14, for example, a Cu film can be used. In this case, a diffusion preventing film (not shown) may be formed between the wiring pattern 14 and the external connection terminal 17. As the diffusion preventing film, for example, a Ni/Au obtained by forming sequentially a Ni layer and an Au layer on the wiring pattern 14 can be used. When a Cu film is used as the wiring pattern 14, a thickness of the wiring pattern 14 can be set to 12 μm, for example.

The wiring pattern 15 is provided on an upper surface 13A of the insulating layer 13. The wiring pattern 15 has a connection portion 15A. The external connection terminal 17 is provided on the connection portion 15A. As the wiring pattern 15, for example, a Cu film can be used. In this case, a diffusion preventing film (not shown) may be formed between the wiring pattern 15 and the external connection terminal 17. As the diffusion preventing film, for example, a Ni/Au obtained by forming sequentially a Ni layer and an Au layer on the wiring pattern 15 can be used. When a Cu film is used as the wiring pattern 15, a thickness of the wiring pattern 15 can be set to 12 μm, for example.

The solder resist 16 is provided on the insulating layer 13 to cover respective portions of the wiring patterns 14, 15 except the connection portions 14A, 15A. The solder resist 16 has opening portions 16A from which the connection portion 14A is exposed respectively, and an opening portion 16B from which the connection portion 15A is exposed.

The external connection terminal 17 is provided on the connection portions 14A, 15A of the wiring patterns 14, 15 respectively. The external connection terminals 17 are the terminals that are connected electrically to the pads provided on a mounting substrate (not shown) such as a motherboard, respectively. As the external connection terminal 17, for example, a solder bump can be used.

According to the semiconductor device of the present embodiment, the recess 12-1A is provided in the internal connection terminal 12 that connects electrically the wiring pattern 14 and the semiconductor chip 11. Also, the recess 14B is provided on the portion, which is arranged on the recess 12-1A, of the wiring pattern 14 such that the portion, which corresponds to the forming area of the recess 14B, of the wiring pattern 14 is brought into contact with the side surface and the bottom surface of the recess 12-1A. Therefore, a contact area between the internal connection terminal 12 and the wiring pattern 14 can be increased, and thus a resistance value between the internal connection terminal 12 and the wiring pattern 14 can be reduced. As a result, the yield of the semiconductor device 10 can be improved.

FIG. 12 to FIG. 22 are views showing steps of manufacturing the semiconductor device according to the first embodiment of the present invention. In FIG. 12 to FIG. 22, the same reference symbols are affixed to the same constituent portions as those of the semiconductor device 10 according to the first embodiment. Also, in FIG. 12 to FIG. 22, B denotes a position along which a dicer cuts the semiconductor substrate 31 into individual pieces (referred to as a "cutting position B" hereinafter).

Figure 12:
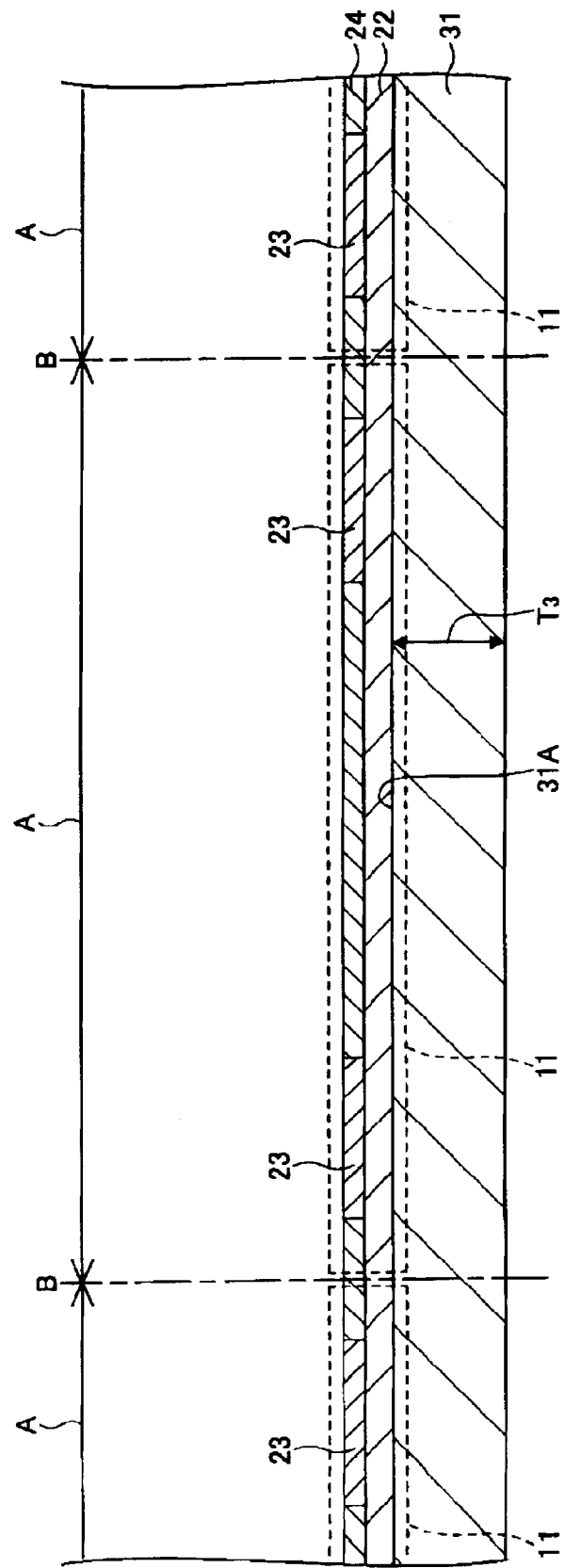
FIG. 12 is a view (#1) showing steps of manufacturing the semiconductor device according to the first embodiment of the present invention.

At first, in steps shown in FIG. 12, the semiconductor chip 11 having the semiconductor integrated circuit 22, the electrode pads 23 and the protection film 24 is formed on the upper surface 31A side of a semiconductor substrate 31, which has a plurality of semiconductor device forming areas A, by the well-known approaches. The semiconductor device forming area A gives the area in which the semiconductor device 10 is formed. The semiconductor substrate 31 serves as the semiconductor substrate 21 explained above (see FIG. 11) when such substrate is thinned and is cut in cutting positions B in steps described later.

As the semiconductor substrate 31, for example, a silicon wafer can be used. When the silicon wafer is used as the semiconductor substrate 31, a thickness $T_3$ of the semiconductor substrate 31 can be set to 500 μm to 775 μm, for example. As the material of the electrode pad 23, for example, Al or an alloy containing Al (e.g., Al—Si—Cu alloy) can be used. As the protection film 24, for example, a SiN film, a PSG film, or the like can be used.

Figure 13:
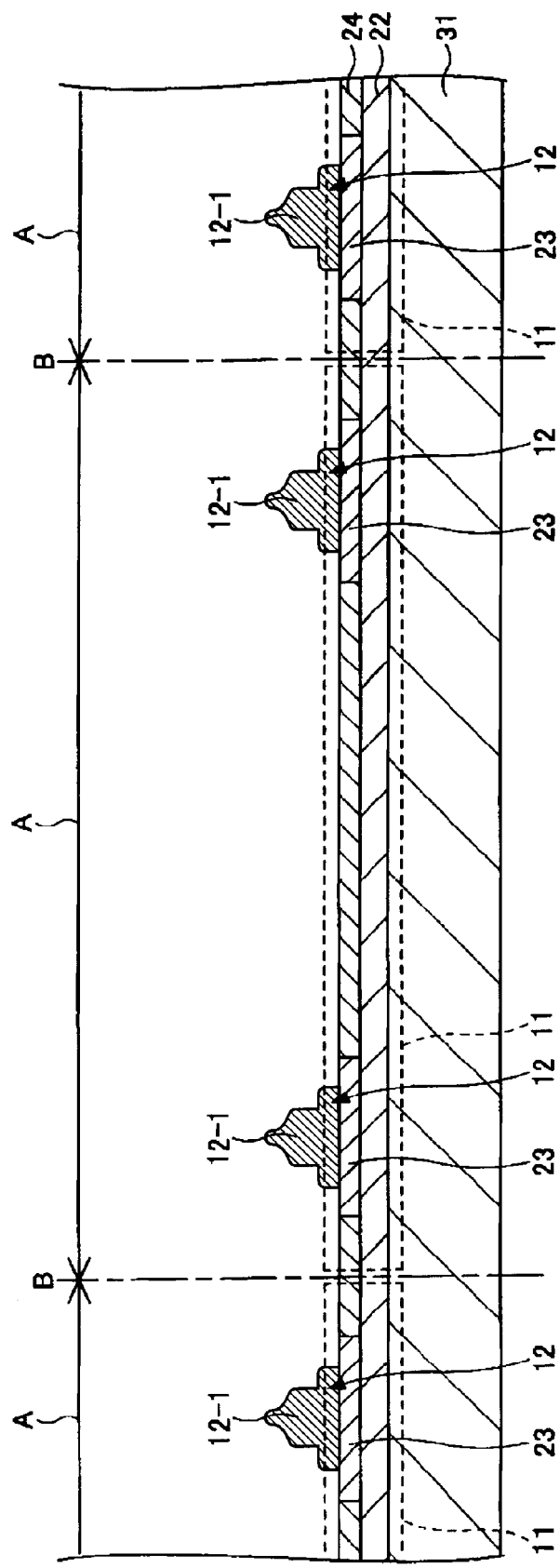
FIG. 13 is a view (#2) showing steps of manufacturing the semiconductor device according to the first embodiment of the present invention.

Then, in steps shown in FIG. 13, the internal connection terminal 12 is formed on a plurality of electrode pads 23 of the structure shown in FIG. 12 respectively. As the internal connection terminal 12, for example, Au bump, Au plating film, metal film consisting of a Ni film formed by the electroless plating method and an Au film covering this Ni film can be used. The Au bump can be formed by the bonding method, for example. In this case, there is variation in height of a plurality of internal connection terminals 12 formed in steps shown in FIG. 13.

Figure 14:
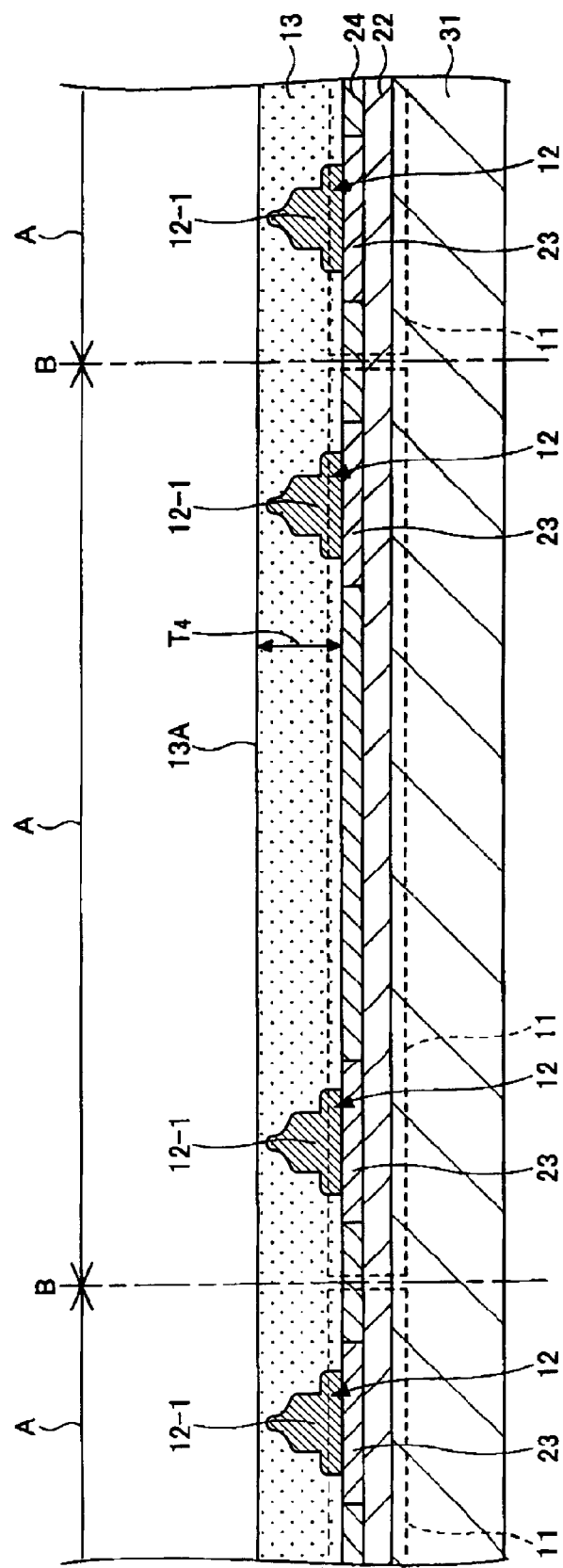
FIG. 14 is a view (#3) showing steps of manufacturing the semiconductor device according to the first embodiment of the present invention.

Then, in steps shown in FIG. 14, the insulating layer 13 is formed to cover the plurality of semiconductor chips 11 and the plurality of internal connection terminals 12 on the side on which the internal connection terminals 12 are provided (insulating layer forming step). As the insulating layer 13, for example, a sheet-like insulating resin with tackiness (e.g., Non Conductive Film (NCF)), a paste-like insulating resin (e.g., Non Conductive Paste (NCP)), an anisotropic conductive resin (e.g., Anisotropic Conductive Film (ACF)) can be used. When the sheet-like insulating resin with tackiness is used, the insulating layer 13 is formed by pasting the sheet-like insulating resin on the upper surface side of the structure shown in FIG. 13. Also, when the paste-like insulating resin is used as the insulating layer 13, the paste-like insulating resin is formed on the upper surface side of the structure shown in FIG. 13 by the printing method, and then the insulating resin is semi-cured by prebaking. This semi-cured insulating resin has an adhesive property. A thickness $T_4$ of the insulating layer 13 can be set to 20 μm to 100 μm, for example.

Figure 15:
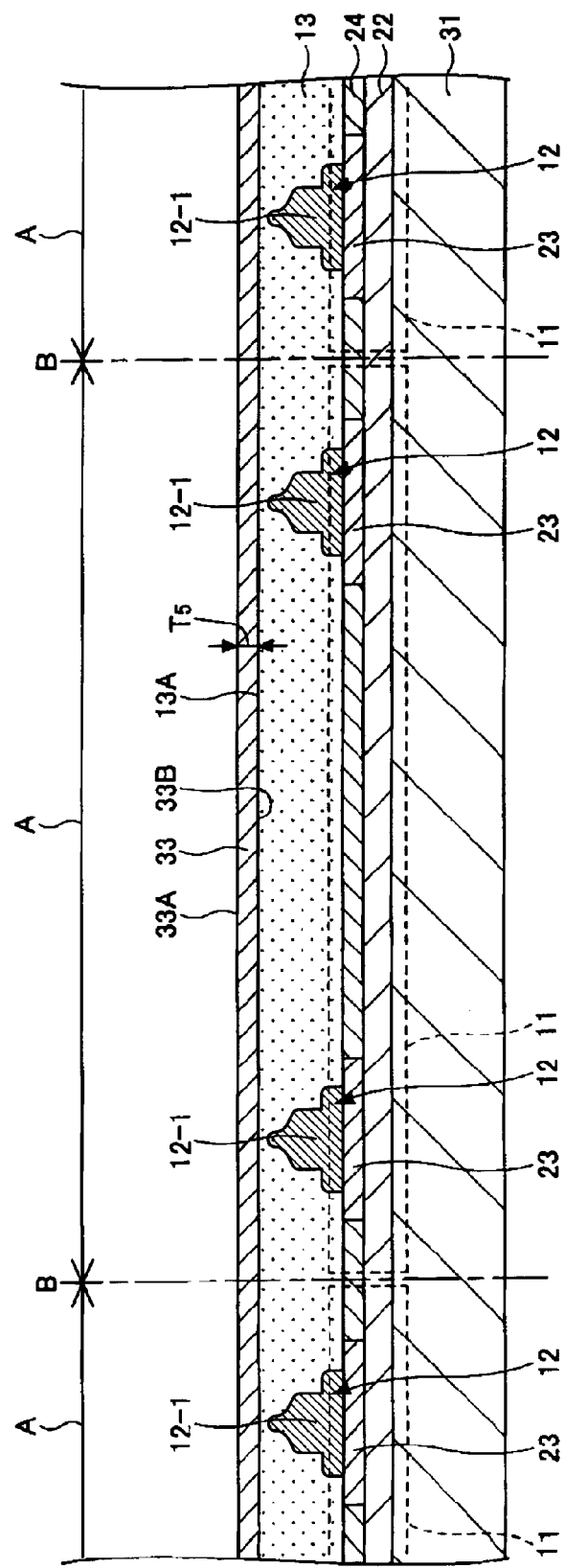
FIG. 15 is a view (#4) showing steps of manufacturing the semiconductor device according to the first embodiment of the present invention.

Then, in steps shown in FIG. 15, a metal layer 33 is formed on the upper surface 13A of the insulating layer 13 (metal layer forming step). Concretely, for example, a Cu foil is used as the metal layer 33, and then this Cu foil is laminated on the upper surface 13A of the insulating layer 13. A thickness $T_5$ of the metal layer 33 can be set to 12 μm, for example. The metal layer 33 serves as the wiring patterns 14, when this layer is etched in steps shown in FIG. 17 as described later.

Figure 16:
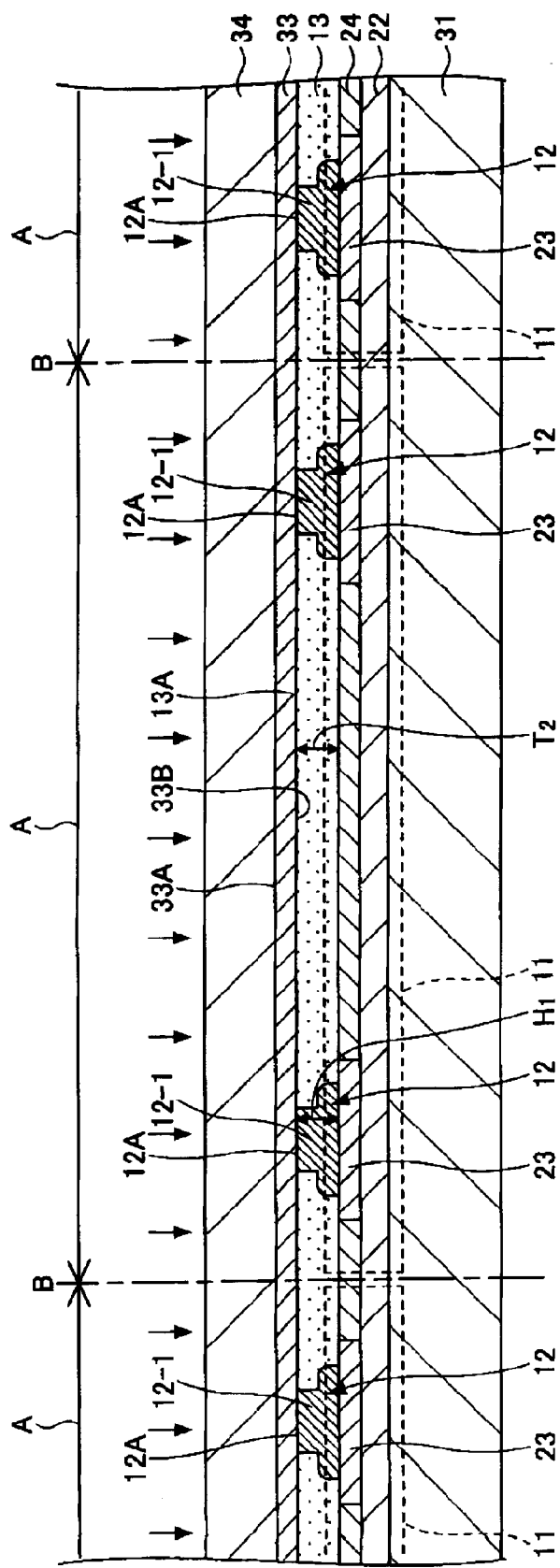
FIG. 16 is a view (#5) showing steps of manufacturing the semiconductor device according to the first embodiment of the present invention.

Then, in steps shown in FIG. 16, a flat plate 34 is arranged on the upper surface 33A of the metal layer 33 in a state that the structure shown in FIG. 15 is being heated, and then a lower surface 33B of the metal layer 33 is brought into contact with the upper end portions 12-1 of the plurality of internal connection terminals 12 by pushing the whole metal layer 33 using the flat plate 34 (metal layer pushing step). Therefore, contact surfaces 12A whose surface is made substantially flat respectively are formed on the upper end portions 12-1 of the plurality of internal connection terminals 12.

The flat plate 34 is removed from the metal layer 33 after the contact surfaces 12A whose surface is made substantially flat respectively are formed on the upper end portions 12-1 of the plurality of internal connection terminals 12. As a pressure applied to push the metal layer 33, for example, 4 MPa (30 mN/cm$^2$) can be used. A thickness $T_2$ of the insulating layer 13 obtained after the metal layer pushing step can be set to 10 μm to 60 μm, for example. Also, a height $H_1$ of the internal connection terminal 12 is substantially equal to a thickness $T_2$ of the insulating layer 13, and can be set concretely to 30 μm, for example.

In this manner, the lower surface 33B of the metal layer 33 is brought into contact with the upper end portions 12-1 of the plurality of internal connection terminals 12 by pushing the whole metal layer 33 such that the contact surfaces 12A whose surface is made substantially flat respectively are formed on the upper end portions 12-1 of the plurality of internal connection terminals 12. Therefore, the step of making the height of the plurality of internal connection terminals 12 uniform and the polishing step of exposing the contact surfaces 12A of the upper end portions 12-1 of the plurality of internal connection terminals 12 from the insulating layer 13, both required in the related art, can be omitted. As a result, the number of manufacturing steps can be reduced, and thus a production cost of the semiconductor device 10 can be reduced.

Figure 17:
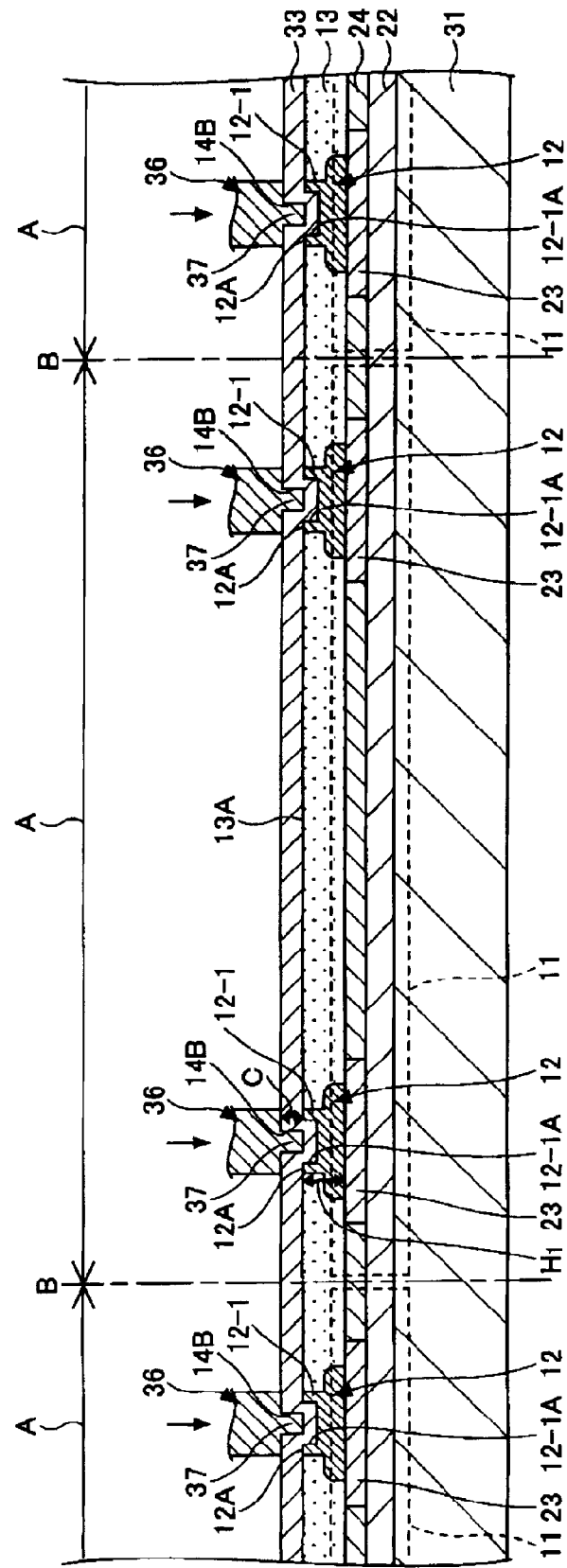
FIG. 17 is a view (#6) showing steps of manufacturing the semiconductor device according to the first embodiment of the present invention.

Then, in steps shown in FIG. 17, a pressing tool 36 having projection portions 37 is prepared, then the projection portions 37 are brought into contact with portions of the metal layer 33 arranged on the upper end portions 12-1 of the internal connection terminals 12 in a state that the structure shown in FIG. 16 is being heated. Then, the portions of the metal layer 33 arranged on the upper end portions 12-1 of the internal connection terminals 12 are pushed (e.g., 10 gf to 30 gf) by the projection portions 37, so that the recess 12-1A as the first recess are formed in the internal connection terminals 12, and the recess 14B as the second recess are formed in the metal layer 33 (recess forming step).

According to the above step, the portions of the metal layer 33 corresponding to the recess 14B contact the side surface and the bottom surface of the recess 12-1A of the internal connection terminal 12 respectively. Therefore, contact areas between the metal layer 33 and the upper end portions 12-1 of the internal connection terminals 12 in the recess forming step can be set larger than contact areas between the metal layer 33 and the upper end portions 12-1 of the internal connection terminals 12 in the metal layer pushing step. As the shape of the projection portion 37, for example, a circular cylinder or a square pillar can be used. Also, when a height $H_1$ of the internal connection terminal 12 is 30 μm, an amount of projection C of the projection portion 37 can be set to 10 μm, for example.

In this manner, the metal layer 33 is brought into contact with the contact surfaces 12A of the upper end portions 12-1 of the internal connection terminals 12 by pushing the whole metal layer 33, and then the portions, which contact the upper end portions of the internal connection terminals 12, of the metal layer 33 are pushed such that the recess 12-1A are formed on the internal connection terminals 12 and the recess 14B are formed on the metal layer 33. Therefore, the bottom surface and the side surface of the recess 12-1A formed on the internal connection terminals 12 come into contact with the metal layer 33, and thus contact areas between the internal connection terminals 12 and the wiring patterns 14 can be increased. As a result, adhesion between the internal connection terminals 12 and the wiring patterns 14 can be improved and also such a situation never occurs that the insulating layer 13 is interposed between the internal connection terminals 12 and the wiring patterns 14 (such a situation can be eliminated that a resistance value between the internal connection terminal 12 and the wiring patterns 14 is increased due to the influence of the insulating layer 13), and thus the yield of the semiconductor device 10 can be improved.

Figure 18:
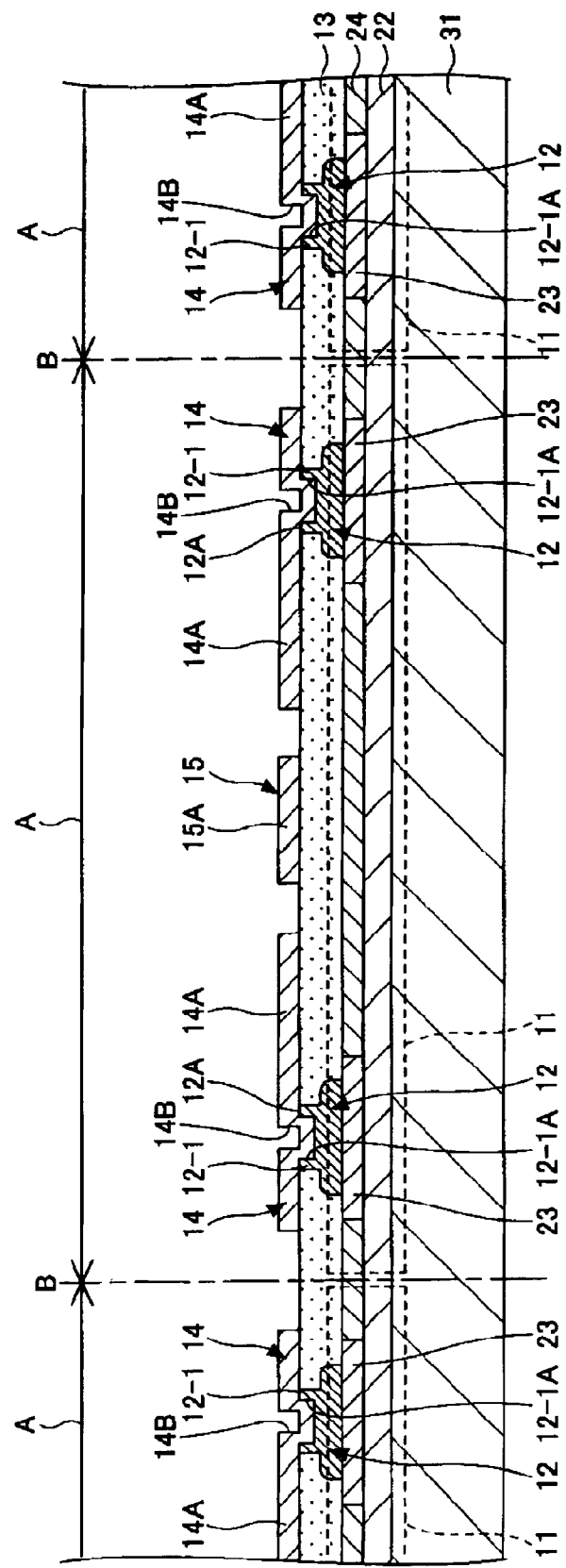
FIG. 18 is a view (#7) showing steps of manufacturing the semiconductor device according to the first embodiment of the present invention.

Then, in steps shown in FIG. 18, the wiring patterns 14, 15 are formed by etching the metal layer 33 shown in FIG. 17 (wiring pattern forming step). Concretely, for example, the patterned resist film (not shown) is formed on the metal layer 33 shown in FIG. 17, and then the metal layer 33 is etched by the etching (e.g., the dry etching or the wet etching) while using this resist film as a mask to form the wiring patterns 14, 15.

Figure 19:
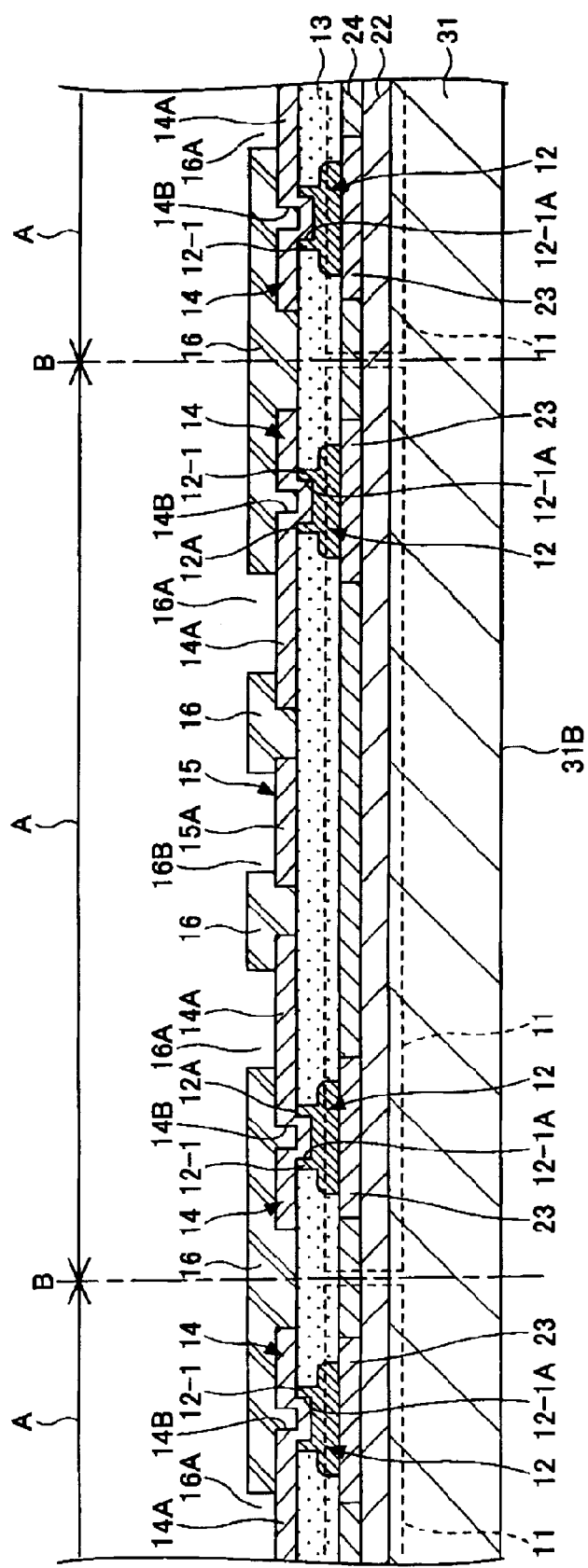
FIG. 19 is a view (#8) showing steps of manufacturing the semiconductor device according to the first embodiment of the present invention.

Then, in steps shown in FIG. 19, the solder resist 16 having the opening portions 16A, 16B is formed on the insulating film 13 to cover the wiring patterns 14, except the connection portions 14A, 15A. The opening portions 16A are formed to expose the connection portion 14A of the wiring pattern 14 respectively. The opening portion 16B is formed to expose the connection portion 15A of the wiring pattern 15.

Figure 20:
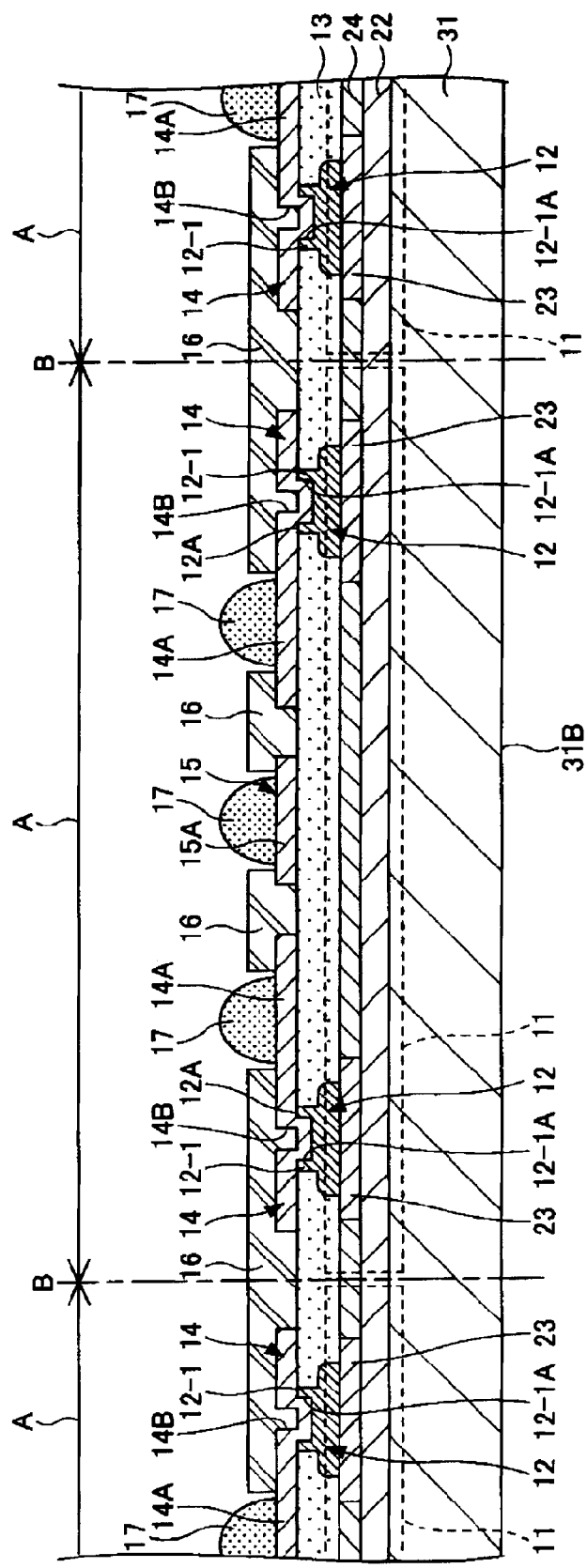
FIG. 20 is a view (#9) showing steps of manufacturing the semiconductor device according to the first embodiment of the present invention.

Then, in steps shown in FIG. 20, the external connection terminal 17 is formed on the connection portions 14A, 15A of the wiring patterns 14, 15 respectively. As the external connection terminal 17, for example, the solder bump can be used.

Figure 21:
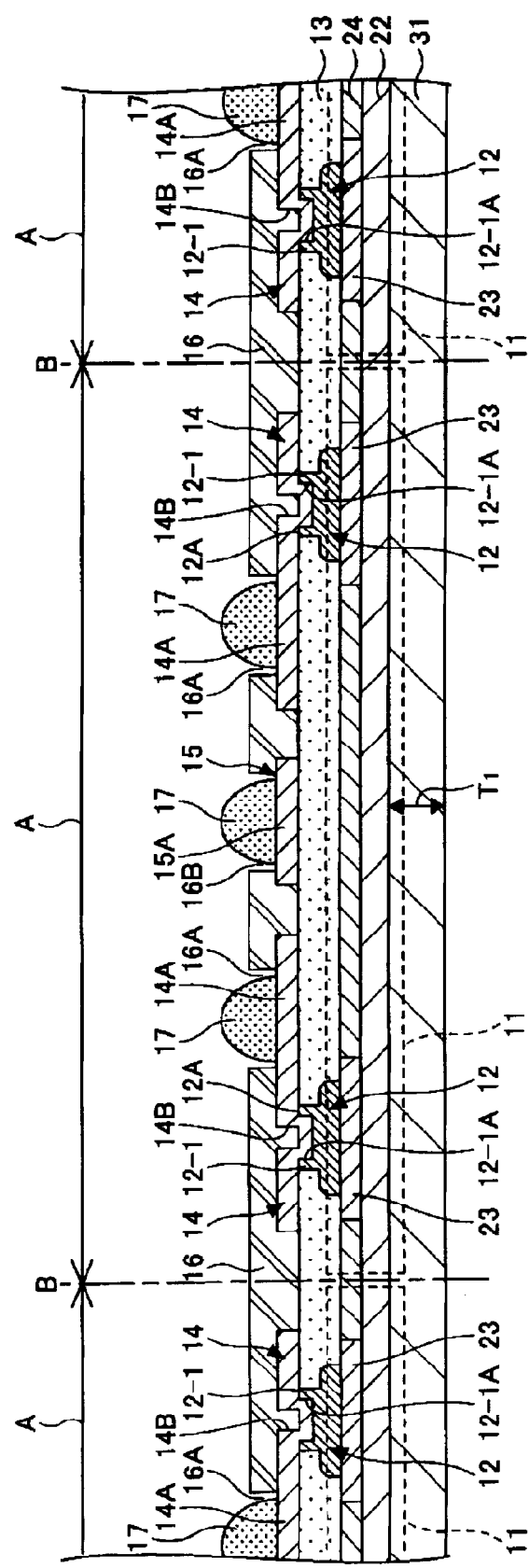
FIG. 21 is a view (#10) showing steps of manufacturing the semiconductor device according to the first embodiment of the present invention.

Then, in steps shown in FIG. 21, the semiconductor substrate 31 is grinded from the lower surface 31B side of the semiconductor substrate 31 shown in FIG. 20 so that a thickness of the semiconductor substrate 31 can be reduced. In order to reduce a thickness of the semiconductor substrate 31, for example, the backside grinder can be used. After grinding, a thickness $T_1$ of the sheet-like semiconductor substrate 31 can be set to 100 μm to 300 μm, for example. Accordingly, the structure corresponding to the semiconductor device 10 is formed in the semiconductor device forming area A.

Figure 22:
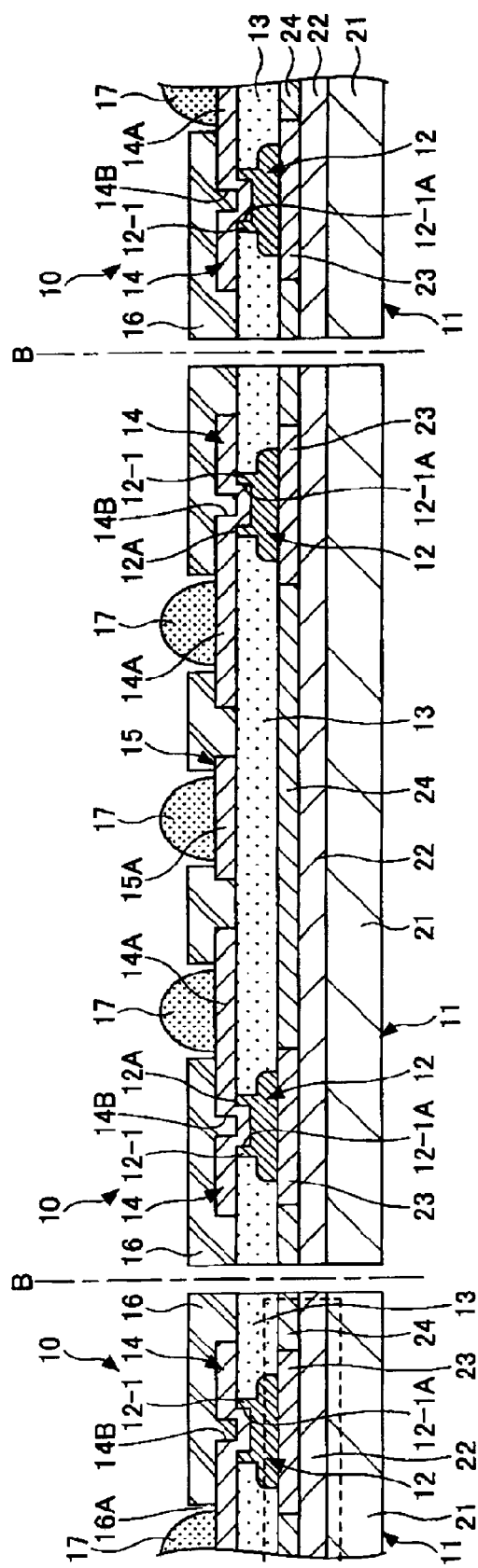
FIG. 22 is a view (#11) showing steps of manufacturing the semiconductor device according to the first embodiment of the present invention.

Then, in steps shown in FIG. 22, a plurality of semiconductor devices 10 are given as individual pieces by cutting the structure shown in FIG. 21 along the cutting position B. As a result, the plurality of semiconductor devices 10 are manufactured.

According to the method of manufacturing the semiconductor device of the present embodiment, the lower surface 33B of the metal layer 33 is brought into contact with the upper end portions 12-1 of the plurality of internal connection terminals 12 by pushing the whole metal layer 33 such that the contact surfaces 12A whose surface is made substantially flat respectively are formed on the upper end portions 12-1 of the plurality of internal connection terminals 12. Therefore, the step of making the height of the plurality of internal connection terminals 12 uniform and the polishing step of exposing the contact surfaces 12A of the upper end portions 12-1 of the plurality of internal connection terminals 12 from the insulating layer 13, both required in the related art, can be omitted. As a result, the number of manufacturing steps can be reduced, and thus a production cost of the semiconductor device 10 can be reduced.

Also, the metal layer 33 is brought into contact with the contact surfaces 12A of the upper end portions 12-1 of the internal connection terminals 12 by pushing the whole metal layer 33, and then the portions, which contact the upper end portions of the internal connection terminals 12, of the metal layer 33 are pushed such that the recess 12-1A are formed on the internal connection terminal 12 and the recess 14B are formed on the metal layer 33. Therefore, the bottom surface and the side surface of the recess 12-1A formed on the internal connection terminal 12 come into contact with the metal layer 33, and thus a contact area between the internal connection terminal 12 and the wiring patterns 14 is increased. As a result, the adhesion between the internal connection terminal 12 and the wiring patterns 14 can be improved and also such a situation never occurs that the insulating layer 13 is interposed between the internal connection terminal 12 and the wiring patterns 14 (such a situation can be eliminated that a resistance value between the internal connection terminal 12 and the wiring patterns 14 is increased due to the influence of the insulating layer 13), and thus the yield of the semiconductor device 10 can be improved.

In the above embodiment, the wiring patterns 14, 15 are formed by etching the metal layer 33 after the recess 12-1A and the recess 14B are formed. However, exemplary embodiments of the present invention are not limited thereto. In this case, the wiring patterns 14, 15 may be formed by etching the metal layer 33 after the metal layer pushing step shown in FIG. 16, and then the recess 12-1A and the recess 14B may be formed.

Figure 23:
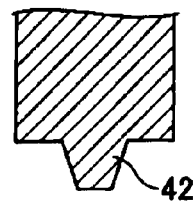
FIG. 23 is a sectional view showing a pressing tool.
Figure 24:
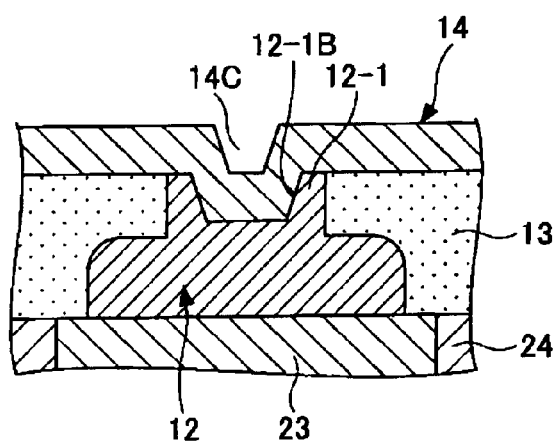
FIG. 24 is a view showing a sectional shape of a recess formed by the pressing tool shown in FIG. 23.

FIG. 23 is a sectional view showing the pressing tool, and FIG. 24 is a view showing a sectional shape of the recess formed by the pressing tool shown in FIG. 23.

The recess forming step may be executed by using a pressing tool 41 having a projection portion 42 whose sectional shape shown in FIG. 23 is formed into a trapezoid, instead of the pressing tool 36 used in the step shown in FIG. 17. In this case, as shown in FIG. 24, a recess 12-1B (whose width is extended gradually upward from the bottom surface of the recess 12-1B) is formed on the upper end portion 12-1 of the internal connection terminal 12, and a recess 14C (whose width is extended gradually upward from the bottom surface of the recess 14C) is formed on the wiring pattern 14.

Figure 25:
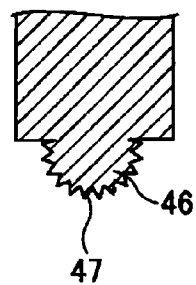
FIG. 25 is a sectional view showing another pressing tool.
Figure 26:
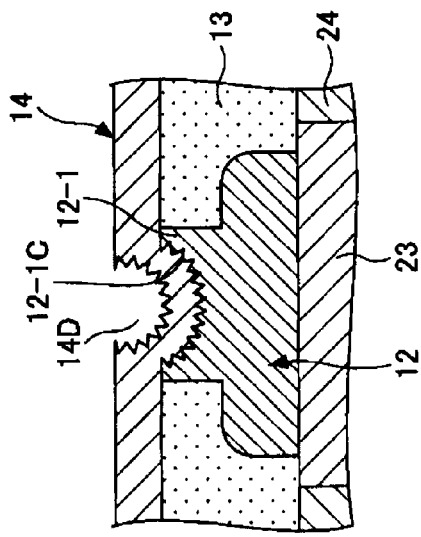
FIG. 26 is a view showing a sectional shape of a recess formed by the pressing tool shown in FIG. 25.

FIG. 25 is a sectional view showing another pressing tool, and FIG. 26 is a view showing a sectional shape of a recess formed by the pressing tool shown in FIG. 25.

The recess forming step may be executed using a pressing tool 45 having a projection portion 46 having a plurality of projections 47 shown in FIG. 25, instead of the pressing tool 36 used in the step shown in FIG. 17. In this case, as shown in FIG. 26, a recess 12-IC to which shapes of the plurality of projections 47 are transferred is formed on the upper end portion 12-1 of the internal connection terminal 12, and a recess 14D to which shapes of the plurality of projections 47 are transferred is formed on the wiring pattern 14.

In this manner, when the recess forming step is executed using the pressing tool 45 having the projection portion 46 having the plurality of projections 47, contact areas between the wiring patterns 14 and the internal connection terminals 12 can be further increased. A height of the projections 47 can be set to 5 μm, for example.

Second Embodiment

Figure 27:
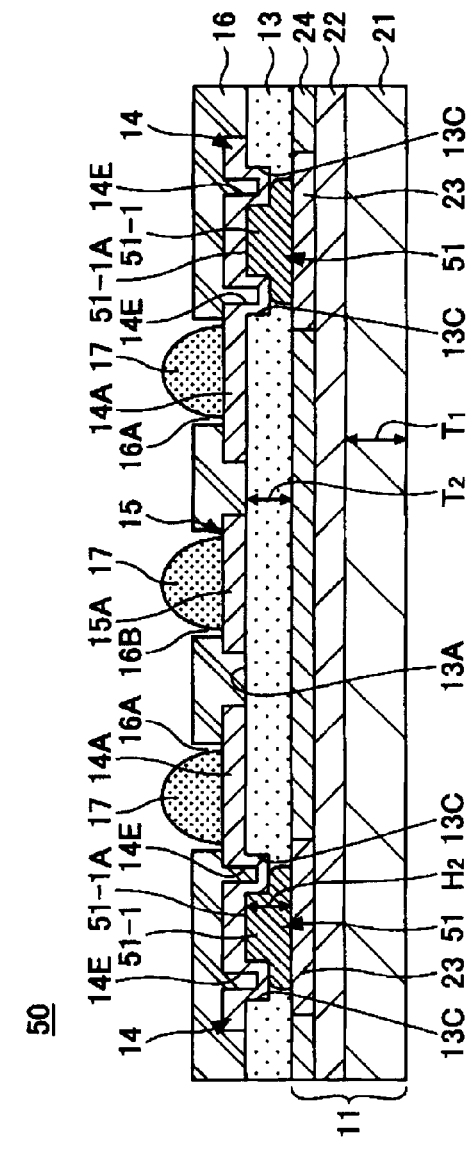
FIG. 27 is a sectional view of a semiconductor device according to a second embodiment of the present invention.

FIG. 27 is a sectional view of a semiconductor device according to a second embodiment of the present invention. In FIG. 27, the same reference symbols are affixed to the same constituent portions as those of the semiconductor device 10 of the first embodiment.

By reference to FIG. 27, a semiconductor device 50 of the second embodiment is constructed similarly to the semiconductor device 10 except that internal connection terminals 51 are provided in place of the internal connection terminals 12 provided to the semiconductor device 10 of the first embodiment, and recess portions 13C are provided on the insulating layer 13, and recess portions 14E are provided in place of the recess 14B provided on the wiring pattern 14.

The internal connection terminal 51 has an upper end portion 51-1 whose upper surface 51-1A is shaped into a substantially flat surface. The upper surface 51-1A of the upper end portion 51-1 is almost the same level as the upper surface 13A of the insulating layer 13, and contacts the wiring pattern 14. A height $H_2$ of the internal connection terminal 51 is set substantially equal to a thickness $T_2$ of the insulating layer 13. The height $H_2$ of the internal connection terminal 51 can be set to 10 μm to 60 μm, for example. As the internal connection terminal 51, for example, Au bump, Au plating film, metal film consisting of a Ni film formed by the electroless plating method and an Au film covering this Ni film can be used. The Au bump can be formed by the bonding method, or the plating method, for example.

The recess portion 13C constitutes a ring-like groove, and is formed on the portion, which is arranged on the outer peripheral portion of the upper end portion 51-1 of the internal connection terminal 51, of the insulating layer 13. The recess portion 13C is formed to expose the outer peripheral side surface of the upper end portion 51-1 of the internal connection terminal 51. A depth of the recess portion 13C can be set to 15 μm, for example.

The recess portion 14E constitutes a ring-like groove, and is formed on the portion, which is arranged over the recess portion 13C, of the wiring pattern 14. The portion, which corresponds to the recess portion 14E, of the wiring pattern 14 is arranged to cover the outer peripheral side surface of the upper end portion 51-1 of the internal connection terminal 51.

According to the semiconductor device of the present embodiment, the wiring patterns 14 are brought into contact with the upper surfaces 51-1A of the upper end portions 51-1 of the internal connection terminal 51, and the ring-like recess portions 13C are provided in the insulating layer 13 to expose the outer peripheral side surfaces of the upper end portions 51-1 of the internal connection terminals 51 and also the ring-like recess portions 14E are provided on the portions, which are arranged over the recess portions 13C, of the wiring patterns 14 such that the outer peripheral side surfaces of the upper end portions 51-1 of the internal connection terminals 51 are covered with the portions, which are arranged over the recess portions 13C, of the wiring patterns 14. Therefore, the contact areas between the internal connection terminals 51 and the wiring patterns 14 can be increased. As a result, the adhesion between the internal connection terminal 51 and the wiring patterns 14 can be improved and also such a situation never occurs that the insulating layer 13 is interposed between the internal connection terminal 51 and the wiring patterns 14 (such a situation can be eliminated that a resistance value between the internal connection terminal 51 and the wiring pattern 14 is increased due to the influence of the insulating layer 13), and thus the yield of the semiconductor device 50 can be improved.

Figure 28:
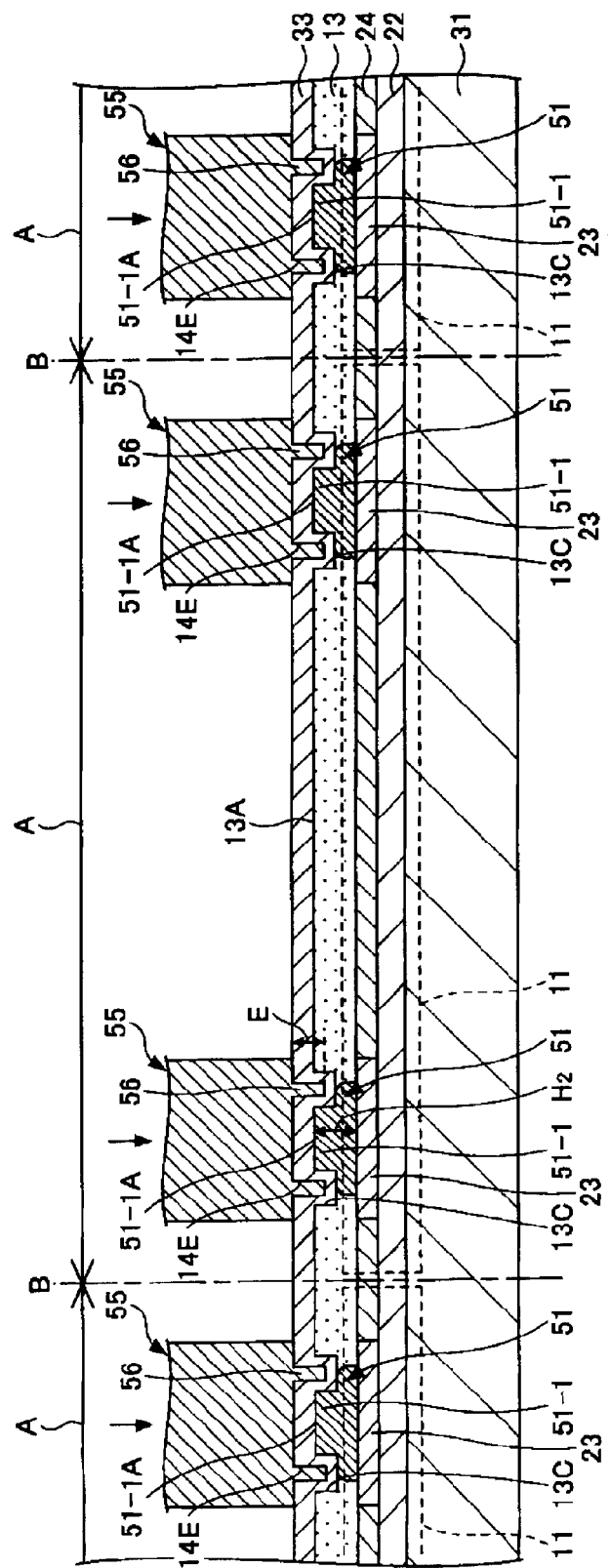
FIG. 28 is a view showing steps of manufacturing the semiconductor device according to the second embodiment of the present invention.

FIG. 28 is a view showing steps of manufacturing the semiconductor device according to the second embodiment of the present invention. In FIG. 28, the same reference symbols are affixed to the structure shown in FIG. 17 described in the first embodiment and the same constituent portions as those of the semiconductor device 50 of the second embodiment.

By reference to FIG. 28, the method of manufacturing the semiconductor device of the second embodiment will be described hereunder. At first, the structure shown in FIG. 16 (the flat plate 34 shown in FIG. 16 is excluded from the constituent elements of the structure shown in FIG. 16) is formed by applying the similar processes to the steps described in the first embodiment and shown in FIG. 12 to FIG. 16.

Then, in steps shown in FIG. 28, a pressing tool 55 having ring-like projection portions 56 is prepared, and the portions of the metal layer 33 which are arranged on the outer peripheral portions of the upper end portions 51-1 of the internal connection terminals 51 provided to the structure shown in FIG. 16 are pushed by the projection portions 56 (a pressure is set to 10 gf to 30 gf, for example) such that the recess portions 13C as the first recess portion are formed on the insulating layer 13 and also the recess portions 14E as the ring-like second recess portions are formed on the metal layer 33 (recess portion forming step).

A width of the projection portion 56 can be set to 5 µm, for example. Also, when a height $H_2$ of the internal connection terminal 51 is set to 30 µm, an amount of projection E of the projection portion 56 can be set to 15 µm, for example.

In this manner, the portions, which are arranged on the outer peripheral portions of the upper end portions 51-1 of the internal connection terminals 51, of the metal layer 33 are pushed using the pressing tool 55 having the ring-like projection portions 56 such that the ring-like recess portions 14E are formed on the metal layer 33 and the recess portions 13C are formed on the insulating layer 13. Therefore, the outer peripheral side surfaces of the upper end portions 51-1 of the internal connection terminals 51 are covered with the portions of the metal layer 33 in which the recess portion 14E is formed respectively, and thus the contact areas between the metal layer 33 and the upper end portions 51-1 of the internal connection terminals 51 in the recess forming step can be set larger than those in the metal layer pushing step.

According to the above process, the contact areas between the internal connection terminals 51 and the wiring patterns 14 can be increased. As a result, the adhesion between the internal connection terminal 51 and the wiring patterns 14 can be improved and also such a situation never occurs that the insulating layer 13 is interposed between the internal connection terminal 51 and the wiring patterns 14 (such a situation can be eliminated that a resistance value between the internal connection terminal 51 and the wiring pattern 14 is increased due to the influence of the insulating layer 13), and thus the yield of the semiconductor device 50 can be improved.

Then, the plurality of semiconductor devices 50 are manufactured by applying the similar processes to the steps described in the first embodiment and shown in FIG. 18 to FIG. 22.

According to the method of manufacturing the semiconductor device of the present embodiment, the metal layer 33 is brought into contact with the upper end portions 51-1 of the internal connection terminals 51 by pushing the overall metal layer 33, and then the portions, which are arranged on the outer peripheral portions of the upper end portions 51-1 of the internal connection terminals 51, of the metal layer 33 are pushed such that the recess portions 13C for exposing the outer peripheral surface of the upper end portion 51-1 of the internal connection terminal 51 respectively are formed in the insulating layer 13 and the recess portions 14E are formed on the metal layer 33. Therefore, the outer peripheral surfaces of the upper end portions of the internal connection terminals 51 comes into contact with the metal layer 33, and thus the contact areas between the internal connection terminals 51 and the metal layer 33 can be increased. As a result, the adhesion between the internal connection terminal 51 and the wiring patterns 14 can be improved and also such a situation never occurs that the insulating layer 13 is interposed between the internal connection terminal 51 and the wiring patterns 14 (such a situation can be eliminated that a resistance value between the internal connection terminal 51 and the wiring pattern 14 is increased due to the influence of the insulating layer 13), and thus the yield of the semiconductor device 50 can be improved.

In the above embodiment, the wiring patterns 14, 15 are formed by etching the metal layer 33 after the recess portions 13C, 14E are formed. However, exemplary embodiments of the present invention are not limited thereto. The wiring patterns 14, may be formed by etching the metal layer 33 after the metal layer pushing step, and then the recess portions 13C, 14E may be formed. Also, the shape of the projection portion 56 of the pressing tool 55 is not limited to the present embodiment. For example, the projection portion 56 may be formed like a discontinuous ring shape.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A semiconductor device, comprising:
   a semiconductor substrate;
   a semiconductor chip formed on the semiconductor substrate and having an electrode pad;
   an insulating layer formed on the semiconductor chip;
   an internal connection terminal formed on the electrode pad and having a first recess, the first recess being exposed from the insulating layer;
   a wiring pattern formed on the insulating layer and having a second recess, the second recess being provided in an area corresponding to an area in which the first recess is provided, wherein the wiring pattern contacts the internal connection terminal in which the first recess is provided;
   a solder resist formed on the wiring pattern and having an opening through which a part of the wiring pattern is exposed; and
   an external connection terminal formed on the exposed wiring pattern.

* * * * *